(12) United States Patent
Hashimoto

(10) Patent No.: US 7,803,344 B2
(45) Date of Patent: Sep. 28, 2010

(54) METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY

(75) Inventor: Tadao Hashimoto, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 125 days.

(21) Appl. No.: 11/977,661

(22) Filed: Oct. 25, 2007

(65) Prior Publication Data

US 2008/0102016 A1  May 1, 2008

Related U.S. Application Data

(60) Provisional application No. 60/854,567, filed on Oct. 25, 2006.

(51) Int. Cl.
  *C01B 21/06* (2006.01)
(52) U.S. Cl. ..................... 423/409; 423/111
(58) Field of Classification Search ............... 423/409, 423/111
  See application file for complete search history.

(56) References Cited

U.S. PATENT DOCUMENTS

| | | | |
|---|---|---|---|
| 6,398,867 B1 | 6/2002 | D'Evelyn et al. | |
| 6,656,615 B2 | 12/2003 | Dwilinski | |
| 7,078,731 B2 | 7/2006 | D'Evelyn et al. | |
| 7,132,730 B2* | 11/2006 | Dwilinski et al. | 257/615 |
| 7,170,095 B2* | 1/2007 | Vaudo et al. | 257/76 |
| 7,303,632 B2* | 12/2007 | Negley | 117/101 |
| 7,368,015 B2* | 5/2008 | D'Evelyn et al. | 117/224 |

OTHER PUBLICATIONS

International Search Report for PCT Application No. PCT/US2007/022607 filed Oct. 25, 2007.
Aoki et al., "GaN single crystal growth using high-purity Na as a flux," Journal of Crystal Growth 242 (2002) 70-76.
Dwilinski et al., "AMMONO method of BN, AlN and GaN synthesis and crystal growth," MRS Internet J. Nitride Semicond. Res. 3, 25 (1998) 1348-1350.
Dwilinski et al., "AMMONO method of GaN and AlN production," Diamond and Related Materials 7 (1998) 1348-1350.
Hashimoto et al., "Ammonothermal growth of GaN on an over-1-inch seed crystal," Japanese Journal of Applied Physics, vol. 44, No. 52, 2005, pp. L1570-L1572.
Inoue et al., "Pressure-controlled solution growth of bulk GaN crystals under high pressure," Phys. Stat. Sol. (b) 223, 15 (2001) 15-27.
Iwahashi et al., "Effects of ammonia gas on threshold pressure and seed growth for bulk GaN single crystals by Na flux method," Journal of Crystal Growth 253 (2003) 1-5.
Ketchum et al., "Crystal growth of gallium nitride in supercritical ammonia," Journal of Crystal Growth 222 (2001) 431-434.
Peters, "Ammonothermal synthesis of aluminium nitride," Journal of Crystal Growth 104 (1990) 411-418.
Porowski, "Near defect free GaN substrates," MRS Internet Journal of Nitride Semiconductor, Res. 4S1 (1999) G1.3, 11 pages.

* cited by examiner

*Primary Examiner*—Timothy C Vanoy
*Assistant Examiner*—Michelle Hou
(74) *Attorney, Agent, or Firm*—Gates & Cooper LLP

(57) ABSTRACT

A method of growing group III-nitride crystals in a mixture of supercritical ammonia and nitrogen, and the group-III crystals grown by this method. The group III-nitride crystal is grown in a reaction vessel in supercritical ammonia using a source material or nutrient that is polycrystalline group III-nitride, amorphous group III-nitride, group-III metal or a mixture of the above, and a seed crystal that is a group-III nitride single crystal. In order to grow high-quality group III-nitride crystals, the crystallization temperature is set at 550° C. or higher. Theoretical calculations show that dissociation of $NH_3$ at this temperature is significant. However, the dissociation of $NH_3$ is avoided by adding extra $N_2$ pressure after filling the reaction vessel with $NH_3$.

18 Claims, 6 Drawing Sheets

METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY

CROSS-REFERENCE TO RELATED APPLICATION

This application claims the benefit under 35 U.S.C. Section 119(e) of the following co-pending and commonly-assigned U.S. patent application:

U.S. Provisional Application Ser. No. 60/854,567, filed on Oct. 25, 2006, by Tadao Hashimoto, entitled "METHOD FOR GROWING GROUP III-NITRIDE CRYSTALS IN MIXTURE OF SUPERCRITICAL AMMONIA AND NITROGEN AND GROUP III-NITRIDE CRYSTALS,"

which application is incorporated by reference herein.

This application is related to the following co-pending and commonly-assigned patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,"

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,"

U.S. Utility patent application Ser. No. 11/765,629, filed on Jun. 20, 2007, by Tadao Hashimoto, Hitoshi Sato, and Shuji Nakamura, entitled "OPTO-ELECTRONIC AND ELECTRONIC DEVICES USING N-FACE GaN SUBSTRATE PREPARED WITH AMMONOTHERMAL GROWTH," which application claims the benefit under 35 U.S.C. Section 119(e) of U.S. Provisional Application Ser. No. 60/815,507, filed on Jun. 21, 2006, by Tadao Hashimoto, Hitoshi Sato, and Shuji Nakamura, entitled "OPTO-ELECTRONIC AND ELECTRONIC DEVICES USING N-FACE GaN SUBSTRATE PREPARED WITH AMMONOTHERMAL GROWTH," and U.S. Provisional Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD,"

which applications are incorporated by reference herein.

BACKGROUND OF THE INVENTION

1. Field of the Invention

The invention is related to a method for growing group III-nitride crystals in a mixture of supercritical ammonia and nitrogen, and group III-nitride crystals grown by the method.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Gallium nitride (GaN), and its ternary and quaternary alloys containing aluminum and indium (AlGaN, InGaN, AlInGaN), has been used in wide variety of light emitting devices and electronic devices, such as light emitting diodes (LEDs), laser diodes (LDs), microwave power transistors, and solar-blind photo detectors. Some of these devices are already in the market, and widely used in cell phones, indicators, displays, etc.

However, these devices are typically grown epitaxially on heterogeneous substrates, such as sapphire and silicon carbide since GaN wafers are not yet available. The heteroepitaxial growth of group III-nitride causes highly defected or even cracked films, which hinders the realization of high-end optical and electronic devices, such as high-brightness LEDs for general lighting and blue LDs for DVD recording.

All the problems related to heteroepitaxial growth of group III-nitride can be ultimately solved by using group III-nitride single crystalline wafers, which are sliced from bulk group III-nitride crystal ingots. However, it is very difficult to grow a bulk crystal of group III-nitride, such as GaN, AlN, and InN, since group III-nitride has a high melting point and high nitrogen vapor pressure at high temperature.

Up to now, a couple of growth methods using molten Ga, such as high-pressure high-temperature synthesis [1,2] and sodium flux [3,4], have been used to obtain bulk group III-nitride crystals. However, the crystal shape grown in molten Ga becomes a thin platelet because molten Ga has low solubility of nitrogen and a low diffusion coefficient of nitrogen.

On the other hand, growth of group III-nitride crystals in supercritical ammonia has been proposed and researched by several groups [5-10]. This new technique called ammonothermal growth has the potential for growing large bulk group III-nitride crystals, because supercritical ammonia used as a fluid medium has high solubility of source materials, such as group III-nitride polycrystals or group III metal, and has high transport speed of dissolved precursors.

However, state-of-the-art ammonothermal method is limited by the growth rate of the group III-nitride crystal, which impedes the application of this method to industrial mass production. The present invention discloses new findings that are derived by theoretical calculations of the equilibrium molar ratio of $NH_3$, $N_2$, and $H_2$ in the ammonothermal reaction. The new findings from these calculations reveal the weak point of the current ammonothermal method. Based on these new findings, a new approach to solving the growth rate problem of the ammonothermal method is disclosed.

SUMMARY OF THE INVENTION

The present invention discloses the theoretically calculated equilibrium molar ratio of $NH_3$ in the typical ammonothermal growth process. According to the calculation, the molar ratio of supercritical $NH_3$ that dissolves and transports the solute was less than 20% of the originally charged amount of $NH_3$. This is caused by the natural dissociation of $NH_3$ into $N_2$ and $H_2$ at high temperature. Because of this dissociation, the available fluid for crystal growth becomes very limited during the growth process, resulting in a low growth rate of the group III-nitride.

The present invention discloses effective growth conditions and procedures to avoid dissociation of $NH_3$ in ammonothermal growth. The main point of the present invention is to fill the free volume of the reactor after the $NH_3$ charge with a high pressure $N_2$ gas. This procedure creates a growth condition that prevents $NH_3$ dissociation during the crystal growth process, thus realizing high speed growth of group III-nitride crystal on a seed crystal.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention provides a method of growing group III-nitride single crystal ingots, primarily group III-nitride single crystals that include at least one of the group III elements B, Al, Ga and In, such as GaN, AlN and InN. The group III-nitride bulk crystal is grown in supercritical $NH_3$ using a source material or nutrient that is a group III-nitride or group III metal, and seed crystals that are a group III-nitride single crystal. The supercritical $NH_3$ provides high solubility of the source materials and high transport speed of dissolved precursors. In order to grow high-quality group III-nitride crystals, the temperature in a crystallization region is maintained at 550° C. or higher. The added high pressure $N_2$ prevents natural dissociation of $NH_3$ at the growth temperature.

TECHNICAL DESCRIPTION OF THE THEORETICAL CALCULATION AND THE INVENTION

It is well known that the $NH_3$ dissociates into $N_2$ and $H_2$ in the following reaction.

$$NH_3(g) \rightleftharpoons \frac{3}{2}H_2(g) + \frac{1}{2}N_2(g)$$

Since the ammonothermal growth of group III-nitride crystals is carried out in high pressure and high temperature $NH_3$, it is very important to estimate the degree of $NH_3$ dissociation in this process. The relationship among the equilibrium constant, K, fugacity ratio, $K_v$, equilibrium molar number of $NH_3$, $n_{NH3}$, equilibrium molar of $N_2$, $n_{N2}$, and equilibrium molar of $H_2$, $n_{H2}$, is given as follows [11]:

$$\frac{n_{NH_3}}{n_{N2}^{1/2} \cdot n_{H2}^{3/2}} \cdot K_v \cdot \left[ \frac{\pi}{n_{NH3} + n_{N2} + n_{H2}} \right]^{1-(1/2+3/2)} = K$$

Setting the equilibrium molar number of $NH_3$ to x, the reaction formula will immediately give the following relationships:

$n_{NH3} = x$ $n_{H2} = 1/2 - 1/2 \cdot x$

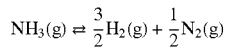

Using these relationships, one will obtain the relationship among K, $K_v$ and x:

$$x = 1 - \sqrt{1 - \frac{300K}{300K + 0.77K_v}}$$

The equilibrium constant K at various temperature is available in the literature [12]: they are 0.0079, 0.0050, 0.0032, 0.0020, 0.0013, 0.00079, and 0.00063 at 700K, 750K, 800K, 850K, 900K, 950K, and 1000K, respectively. Although $K_v$ values at high temperature and high pressure are not readily available, reasonable extrapolation is possible from existing data [13].

Figure 1:
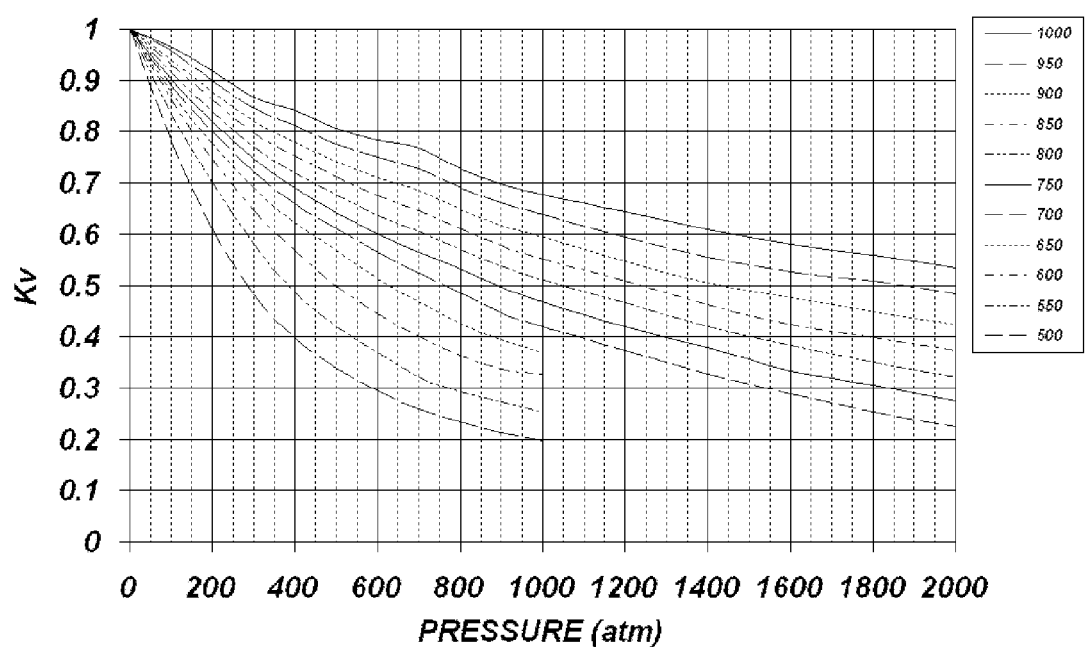
FIG. 1 is extrapolated data of fugacity constant for $NH_3$ at various temperature and pressure (where the numbers in the box legend are the temperature in K)

FIG. 1 is a graph that shows the extrapolated $K_v$ values at various temperature and pressure. Using these data, the equilibrium $NH_3$ molar ratio at various temperatures and pressures was calculated as shown in the graph of FIG. 2.

Figure 2:
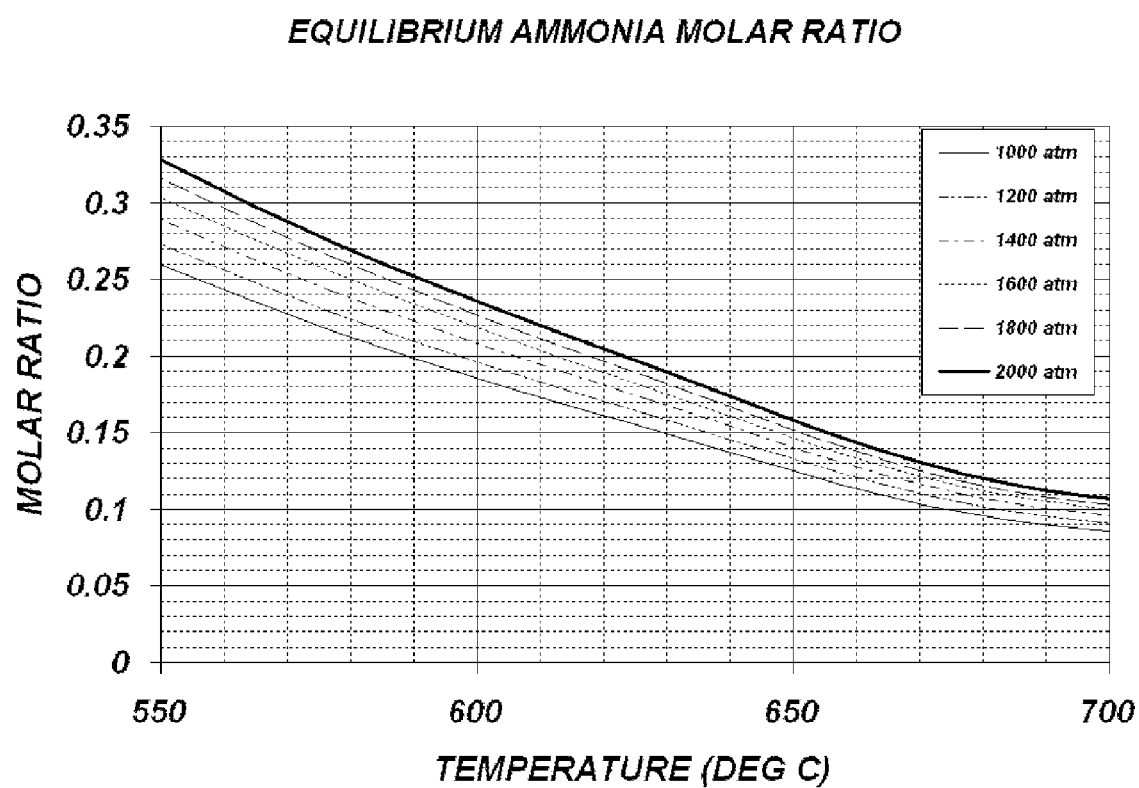
FIG. 2 is theoretically calculated equilibrium $NH_3$ molar ratio at various temperatures and pressures.

In FIG. 2, the majority of charged $NH_3$ is dissociated into $N_2$ and $H_2$ in the typical temperature and pressure conditions for ammonothermal growth of group III-nitride crystals. Only less than 35% of the original amount of $NH_3$ acts as crystal growth medium. Although it appears from the reaction formula that increasing the pressure by charging more $NH_3$ will help in preventing $NH_3$ dissociation, even doubling the pressure (i.e. 1000 atm to 2000 atm) results in a minor increase of the $NH_3$ molar ratio above 550° C. Since group III-nitride crystals have high melting points, crystal growth needs a relatively high temperature as compared to other semiconductor materials and oxide crystals. For example, GaN with a commercially usable quality can only be grown at temperatures higher than 550° C. Therefore, in order to grow high-quality group III-nitride crystals with a commercially practical growth rate, it is important to prevent $NH_3$ dissociation at temperatures above 550° C.

Adding extra $N_2$ pressure in the reactor will effectively prevent the $NH_3$ dissociation process. When the molar ratio of $NH_3$ is 0.2, the $N_2$ molar ratio is about 0.4 and the $H_2$ molar ratio is about 1.2, resulting in a $N_2$ partial pressure at about 440 atm. Therefore, adding the same order of $N_2$ pressure (e.g. ~100 atm) will help in preventing the $NH_3$ dissociation.

EXAMPLES

A number of examples are described and illustrated with reference to FIGS. 3, 4, 5 and 6.

Figure 3:
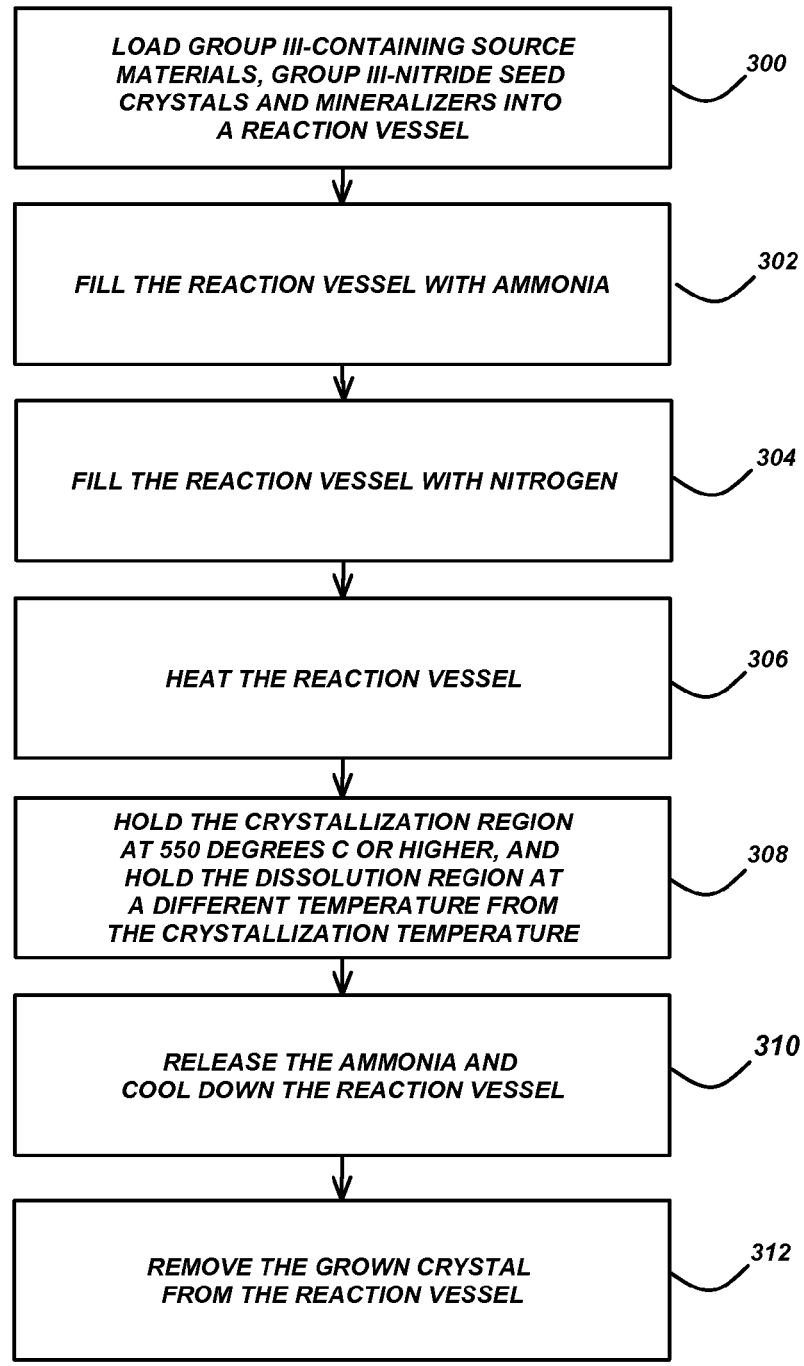
FIG. 3 is a flow chart that describes one example of the ammonothermal growth of group III-nitride crystals with source materials that do not contain a metallic form of the group III element.

FIG. 3 is a flow chart that describes one example of the ammonothermal growth of group III-nitride crystals with source materials that do not contain a metallic form of the group III element, wherein Block 300 represents the step of loading group III-containing source materials, group III-nitride seed crystals and mineralizers into a reaction vessel or autoclave; Block 302 represents the step of filling the reaction vessel with ammonia; Block 304 represents the step of filling the reaction vessel with nitrogen; Block 306 represents the step of heating the reaction vessel; Block 308 represents the step of holding the crystallization region of the reaction vessel at 550° C. or higher, and holding the dissolution region of the reaction vessel at a different temperature from the crystallization region temperature; Block 310 represents the step of releasing the ammonia and cooling down the vessel; and Block 312 represents the step of removing the grown crystal from the reaction vessel.

Figure 4:
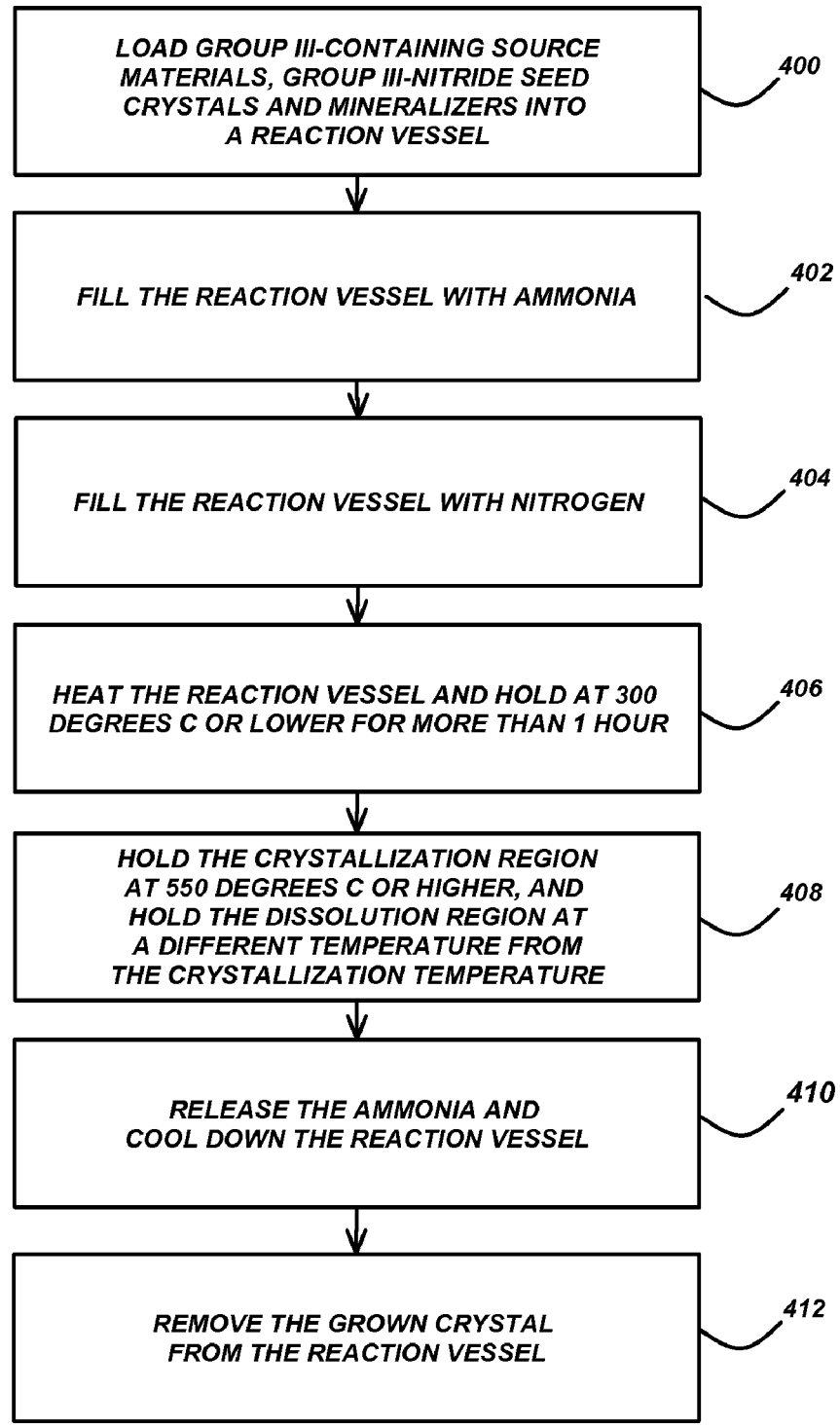
FIG. 4 is a flowchart that describes one example of the ammonothermal growth of group III-nitride crystals with source materials that contain a metallic form of the group III element.

FIG. 4 is a flowchart that describes one example of the ammonothermal growth of group III-nitride crystals with source materials that contain a metallic form of the group III element, wherein Block 400 represents the step of loading group III-containing source materials, group III-nitride seed crystals and mineralizers into a reaction vessel; Block 402 represents the step of filling the reaction vessel with ammonia; Block 404 represents the step of filling the reaction vessel with nitrogen; Block 406 represents the step of heating the reaction vessel and holding the temperature of the reaction vessel at 300° C. for more than 1 hour; Block 408 represents the step of holding the crystallization region of the reaction vessel at 550° C. or higher, and holding the dissolution region of the reaction vessel at a different temperature from the crystallization region temperature; Block 410 represents the step of releasing the ammonia and cooling down the vessel; and Block 412 represents the step of removing the grown crystal from the reaction vessel.

Figure 5:
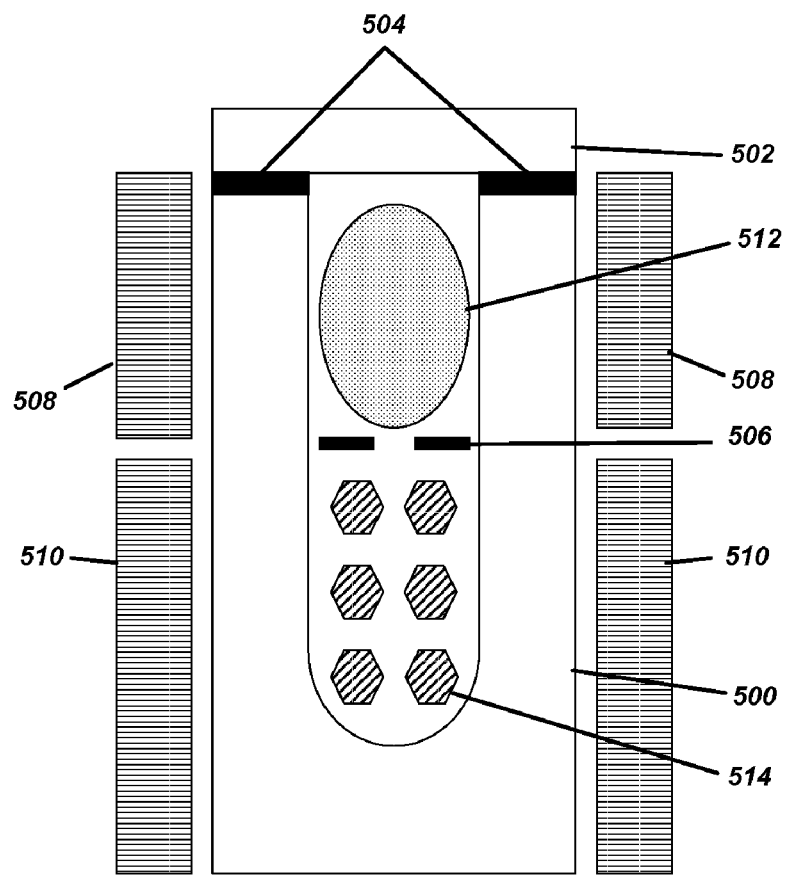
FIG. 5 is an example of the ammonothermal growth apparatus for basic mineralizers.

FIG. 5 is an example of the ammonothermal growth apparatus for basic mineralizers, including a reaction vessel 500, lid 502, gasket 504, convection-restricting device 506, top heater 508 for the dissolution region, bottom heater 510 for the crystallization region, group III-containing source materials 512, and group III-nitride seed crystals 514.

Figure 6:
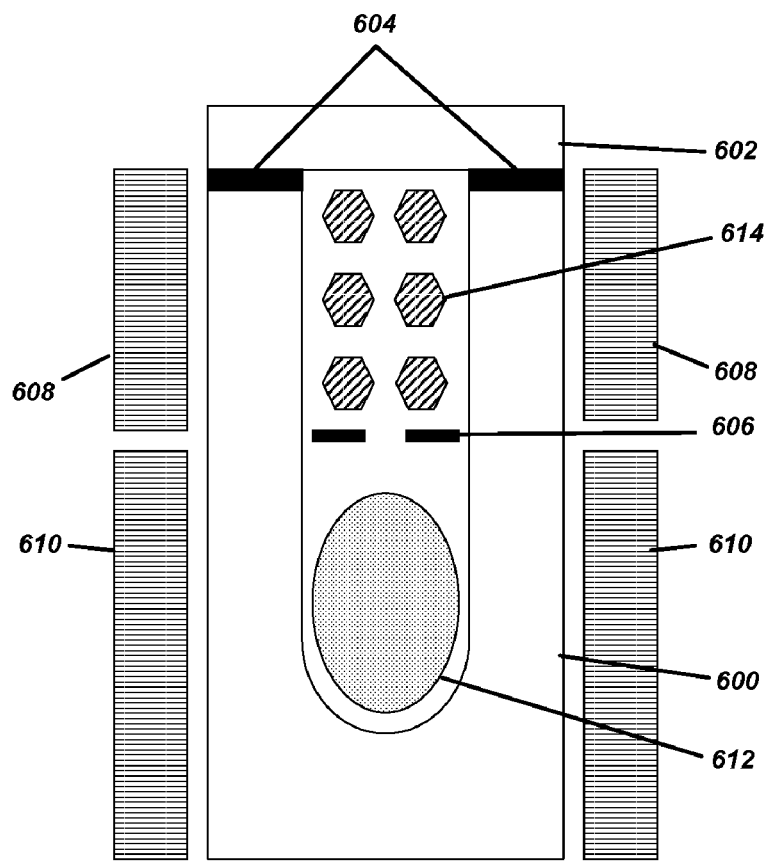
FIG. 6 is an example of the ammonothermal growth apparatus for acidic mineralizers.

FIG. 6 is an example of the ammonothermal growth apparatus for acidic mineralizers, including a reaction vessel 600, lid 602, gasket 604, convection-restricting device 606, top heater 608 for the crystallization region, bottom heater 610 for the dissolution region, group III-containing source materials 612, and group III-nitride seed crystals 614.

Example 1

Example 1 of the present invention describes how to grow single crystalline GaN bulk crystals with basic mineralizers (i.e. $LiNH_2$, $NaNH_2$ or $KNH_2$) and polycrystalline GaN source materials. This example is based on FIGS. 3 and 5, where FIG. 3 is a flow chart of the ammonothermal growth process used in this example, and FIG. 5 is the ammonothermal growth apparatus used in this example. Since the crystallization region of the reaction vessel 500 is maintained at 550° C. or higher and the pressure of the reaction vessel 500 is typically higher than 1000 atm, the reaction vessel 500 must be constructed with a precipitation hardened Ni—Cr based superalloy, such as Rene 41, Inconel X-750, and Inconel 718. Although the basic ammonia does not cause any corrosion problem on these superalloy materials, an internal liner made of vanadium or Haynes 230 can be used to reduce impurities in the grown crystal.

The first step (300) is to place the GaN single crystalline seeds 514 in the crystallization region of the reaction vessel 500. Typically, the seed crystals 514 are hung with Ni or Ni—Cr wire below a convection-restricting device 506, such as a baffle, because GaN has retrograde solubility in ammonobasic solutions. After loading the seed crystals 514 and one or more baffles 506, the reaction vessel 500 is loaded with polycrystalline GaN granules 512. The polycrystalline GaN granules 512 are typically held in a Ni or Ni—Cr woven mesh basket to increase the exposure of the source to $NH_3$. Then, the reactor vessel 500 is transferred to a glove box in which the $O_2$ and $H_2O$ concentration is less than 1 ppm. In the glove box, moisture sensitive alkali amide (i.e. $LiNH_2$, $NaNH_2$ or $KNH_2$) mineralizers are loaded.

The second step (302) is filling the reactor vessel 500 with $NH_3$. The reactor vessel 500 is sealed and chilled by immersing the reactor vessel 500 in liquid $N_2$. Then, gaseous $NH_3$ is introduced through an $NH_3$ inlet port which is equipped with a high-pressure valve (this port and valve are not shown in FIG. 5). A typical fill factor is about 50% or more.

After condensation of the $NH_3$ in the reaction vessel 500, $N_2$ is introduced through the same port (304). The pressure of $N_2$ should be more than 100 atm to avoid dissociation of $NH_3$ during the crystal growth process.

After closing the high-pressure valve, the reaction vessel 500 is heated (306).

The temperature of the crystallization region (i.e. the bottom heater 510) is maintained at 550° C. or higher and the temperature of the dissolution region (i.e. the top heater 508) is maintained at a lower temperature than the bottom heater 508 (308).

After a designated growth time, the $NH_3$ and $N_2$ are released by opening the high-pressure valve, and the reaction vessel 500 is cooled (310). If necessary, the screws to hold the lid 502 can be loosened at an elevated temperature to avoid the seizing of the screws.

When the reaction vessel 500 is cooled, grown crystals are removed (312).

Example 2

Example 2 of the present invention describes how to grow single crystalline GaN bulk crystals with basic mineralizers (i.e. $LiNH_2$, $NaNH_2$ or $KNH_2$) and metallic Ga source. This example is based on FIGS. 4 and 5, where FIG. 4 is a flow chart of the ammonothermal growth process used in this example, while FIG. 5 is the ammonothermal growth apparatus used in this example. Since the crystallization region of the reaction vessel 500 is maintained at 550° C. or higher, and the pressure of the reaction vessel 500 is typically higher than 1000 atm, the reaction vessel 500 must be constructed with a precipitation hardened Ni—Cr based superalloy, such as Rene 41, Inconel X-750, and Inconel 718. Although the basic ammonia does not cause any corrosion problem on these superalloy materials, an internal liner made of vanadium or Haynes 230 can be used to reduce impurities in the grown crystal.

The first step (400) is to place the GaN single crystalline seeds 514 in the crystallization region of the reaction vessel 500. Typically, the seed crystals 514 are hung with a Ni or Ni—Cr wire below a convection-restricting device 506, such as a baffle, because GaN has retrograde solubility in ammonobasic solutions. After loading the seed crystals 514 and one or more baffles 506, the reaction vessel 500 is loaded with metallic Ga. Since the metallic Ga will melt during temperature ramp, the metallic Ga is typically held in a Ni or Ni—Cr crucible. Then, the reactor vessel 500 is transferred to a glove box in which the $O_2$ and $H_2O$ concentration is less than 1 ppm. In the glove box, moisture sensitive alkali amide (i.e. $LiNH_2$, $NaNH_2$ or $KNH_2$) mineralizers are loaded.

The second step (402) is the filling of the reactor vessel 500 with $NH_3$. The reactor vessel 500 is sealed and chilled by immersing the reactor vessel 500 in liquid $N_2$. Then, gaseous $NH_3$ is introduced through an $NH_3$ inlet port which is equipped with high-pressure valve (this port and valve are not shown in FIG. 5). A typical fill factor is about 50% or more.

After condensation of the $NH_3$ in the reaction vessel 500, $N_2$ is introduced through the same port (404). The pressure of the $N_2$ should be more than 100 atm to avoid dissociation of $NH_3$ during the crystal growth process.

After closing the high-pressure valve, the reaction vessel 500 is heated (406). First, the reaction vessel 500 is maintained at a moderate temperature below 300° C. to transform the metallic Ga into a nitrogen containing compound. A typical holding time is 24 hours.

Then, the temperature of the crystallization region (i.e. the bottom heater 510) is ramped and maintained at 550° C. or higher, and the temperature of the dissolution region (i.e. the top heater 508) is maintained at a lower temperature than the bottom heater 508 (408).

After a designated growth time, the $NH_3$ and $N_2$ are released by opening the high-pressure valve, and the reaction vessel 500 is cooled (410). If necessary, the screws to hold the lid 502 can be loosened at an elevated temperature to avoid the seizing of the screws.

When the reaction vessel 500 is cooled, grown crystals are removed (412).

Example 3

Example 3 of the present invention describes how to grow single crystalline GaN bulk crystals with acidic mineralizers (i.e. $NH_4F$, $NH_4Cl$, $NH_4Br$ or $NH_4I$) and polycrystalline GaN source. This example is based on FIGS. 3 and 6, where FIG. 3 is a flow chart of the ammonothermal growth process used in this example, while FIG. 6 is an the ammonothermal growth apparatus used in this example. Since the crystallization region of the reaction vessel 600 is maintained at 550° C. or higher, and the pressure of the reaction vessel 600 is typically higher than 1000 atm, the reaction vessel 600 must be constructed with a precipitation hardened Ni—Cr based superalloy, such as Rene 41, Inconel X-750, and Inconel 718. In addition, since the acidic ammonia causes a serious corrosion problem on these superalloy materials, an internal liner made of platinum, palladium, or an alloy of platinum and palladium, must be used. This liner layer is also effective in reducing impurities in the grown crystal.

The first step (300) is to load polycrystalline GaN granules 612. Typically, the polycrystalline GaN granules 612 are held in a platinum basket. Then, one or more baffles 606 are loaded into the reaction vessel 600. Typically, the seed crystals 614 are hung with a platinum wire above the baffles 606, because GaN has normal solubility in ammonoacidic solutions. After loading the seed crystals 614, the reactor vessel 600 is transferred to a glove box in which the $O_2$ and $H_2O$ concentration is less than 1 ppm. In the glove box, moisture sensitive ammonium halide (i.e. $NH_4F$, $NH_4Cl$, $NH_4Br$ or $NH_4I$) mineralizers are loaded.

The second step (302) is filling the reactor vessel 600 with $NH_3$. The reactor vessel 600 is sealed and chilled by immersing the reactor vessel 600 in liquid $N_2$. Then, gaseous $NH_3$ is introduced through an $NH_3$ inlet port which is equipped with high-pressure valve (this port and valve are not shown in FIG. 6). A typical fill factor is about 50% or more.

After condensation of the $NH_3$ in the reaction vessel 600, $N_2$ is introduced through the same port (304). The pressure of the $N_2$ should be more than 100 atm to avoid dissociation of $NH_3$ in the crystal growth process.

After closing the high-pressure valve, the reaction vessel 600 is heated (306).

The temperature of the crystallization region (i.e. the top heater 608) is maintained at 550° C. or higher, and the temperature of the dissolution region (i.e. the bottom heater 610) is maintained at a higher temperature than the top heater 608 (308).

After maintaining a designated growth time, the $NH_3$ and $N_2$ are released by opening the high-pressure valve, and the reaction vessel 600 is cooled (310). If necessary, the screws to hold the lid 602 can be loosened at an elevated temperature to avoid the seizing of the screws.

When the reaction vessel 600 is cooled, grown crystals are removed (312).

Example 4

Example 4 of the present invention describes how to grow single crystalline GaN bulk crystals with acidic mineralizers (i.e. $NH_4F$, $NH_4Cl$, $NH_4Br$ or $NH_4I$) and metallic Ga source. This example is based on FIGS. 4 and 6, where FIG. 4 is a flow chart of the ammonothermal growth process used in this example, while FIG. 6 is the ammonothermal growth apparatus used in this example. Since the crystallization region of the reaction vessel 600 is maintained at 550° C. or higher, and the pressure of the reaction vessel 600 is typically higher than 1000 atm, the reaction vessel 600 must be constructed with a precipitation hardened Ni—Cr based superalloy, such as Rene 41, Inconel X-750, and Inconel 718. In addition, since the acidic ammonia causes a serious corrosion problem on these superalloy materials, an internal liner made of platinum, palladium, or an alloy of platinum and palladium, must be used. This liner layer is also effective in reducing impurities in the grown crystal.

The first step (400) is to load metallic Ga. Typically, the metallic Ga granules are held in a platinum crucible. Then, one or more baffles 606 are loaded into the reaction vessel 600. Typically, the seed crystals 614 are hung with a platinum wire above the baffle 606, because GaN has normal solubility in ammonoacidic solutions. After loading the seed crystals 614, the reactor vessel 600 is transferred to a glove box in which the $O_2$ and $H_2O$ concentration is less than 1 ppm. In the glove box, moisture sensitive ammonium halide (i.e. $NH_4F$, $NH_4Cl$, $NH_4Br$ or $NH_4I$) mineralizers are loaded.

The second step (402) is filling the reactor vessel 600 with $NH_3$. The reactor vessel 600 is sealed and chilled by immersing the reactor vessel 600 in liquid $N_2$. Then, gaseous $NH_3$ is introduced through an $NH_3$ inlet port which is equipped with high-pressure valve (this port and valve are not shown in FIG. 6). A typical fill factor is about 50% or more.

After condensation of the $NH_3$ in the reaction vessel 600, $N_2$ is introduced through the same port (404). The pressure of the $N_2$ should be more than 100 atm to avoid dissociation of $NH_3$ during the crystal growth process.

After closing the high-pressure valve, the reaction vessel 600 is heated (406). First, the reaction vessel 600 is maintained at a moderate temperature below 300° C. to transform the metallic Ga into a nitrogen containing compound. A typical holding time is 24 hours.

Then, the temperature of the crystallization region (i.e. the top heater 608) is ramped and maintained at 550° C. or higher, and the temperature of the dissolution region (i.e. the bottom heater 610) is maintained at a higher temperature than the top heater 608 (408).

After a designated growth time, the $NH_3$ and $N_2$ are released by opening the high-pressure valve, and the reaction vessel 600 is cooled (410). If necessary, the screws to hold the lid 602 can be loosened at an elevated temperature to avoid the seizing of the screws.

When the reaction vessel 600 is cooled, grown crystals are removed (412).

Advantages and Improvements

The theoretical calculation in the present invention revealed that, in existing methods, the majority amount of $NH_3$ dissociates when the crystallization temperature is maintained at 550° C. or higher. Because of this problem, when high-quality group III-nitride single crystal, which requires a growth temperature higher than 550° C., is grown using the ammonothermal method, its growth rate becomes very slow. The present invention solves this dissociation problem by adding extra $N_2$ pressure after the $NH_3$ charge. This extra $N_2$ pressure prevents the $NH_3$ dissociation at high temperatures, resulting in a higher amount of active fluid medium for crystal growth. Therefore, the present invention provides a growth method of high-quality group III-nitride bulk crystals at commercially practical growth rate.

REFERENCES

The following references are incorporated by reference herein:

[1]. S. Porowski, MRS Internet Journal of Nitride Semiconductor, Res. 4S1, (1999) G1.3.

[2] T. Inoue, Y. Seki, O. Oda, S. Kurai, Y. Yamada, and T. Taguchi, Phys. Stat. Sol. (b), 223 (2001) p. 15.

[3] M. Aoki, H. Yamane, M. Shimada, S. Sarayama, and F. J. DiSalvo, J. Cryst. Growth 242 (2002) p. 70.

[4] T. Iwahashi, F. Kawamura, M. Morishita, Y. Kai, M. Yoshimura, Y. Mori, and T. Sasaki, J. Cryst Growth 253 (2003) p. 1.

[5] D. Peters, J. Cryst. Growth 104 (1990) pp. 411-418.

[6] R. Dwiliński, R. Doradziński, J. Garczyński, L. Sierzputowski, J. M. Baranowski, M. Kamińska, Diamond and Related Mat. 7 (1998) pp. 1348-1350.

[7] R. Dwiliński, R. Doradziński, J. Garczyński, L. Sierzputowski, M. Palczewska, Andrzej Wysmolek, M. Kamińska, MRS Internet Journal of Nitride Semiconductor, Res. 3 25 (1998).

[8] Douglas R. Ketchum, Joseph W. Kolis, J. Cryst. Growth 222 (2001) pp. 431-434.

[9] R. Dwiliński, R. Doradziński, J. Garczyński, L. Sierzputowski, Y. Kanbara, U.S. Pat. No. 6,656,615.

[10] T. Hashimoto, K. Fujito, M. Saito, J. S. Speck, and S. Nakamura, Jpn. J. Appl. Phys. 44 (2005) L1570.

[11] Derived from equation 29, page 716 of Hougen Watson, "Chemical Process Principles", John Wiley, New York, (1945).

[12] FIG. 156, page 712 of Hougen Watson, "Chemical Process Principles", John Wiley, New York, (1945).

[13] FIG. 156a, page 718 of Hougen Watson, "Chemical Process Principles", John Wiley, New York, (1945).

CONCLUSION

This concludes the description of the preferred embodiment of the invention. The following describes some alternative embodiments for accomplishing the present invention.

Although the preferred embodiment describes the growth of GaN as an example, other group III-nitride crystals may be used in the present invention. The group III-nitride materials may include at least one of the group III elements B, Al, Ga, and In.

Although the preferred embodiment describes the use of polycrystalline GaN or metallic Ga source, other forms of source materials such as amorphous GaN, gallium amide, gallium imide may be used in the present invention.

Although the preferred embodiment describes the reaction vessel without internal chamber, an internal chamber may be used to attain safe handling of liquid $NH_3$.

In the preferred embodiment, specific growth apparatus are presented. However, other apparatus, constructions or designs that fulfill the conditions described herein will have the same benefit as these examples.

The present invention does not have any limitations on the size of the reaction vessel or autoclave, so long as the same benefits can be obtained.

Although the preferred embodiment explains the process step in which $NH_3$ is released at an elevated temperature, $NH_3$ can also be released after the reaction vessel is cooled, so long as seizing of screws does not occur.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An ammonothermal method for growing group III-nitride crystals, comprising:
   (a) loading group III-containing source materials, group III-nitride seed crystals, and mineralizers into a reaction vessel;
   (b) filling the reaction vessel with ammonia;
   (c) adding extra nitrogen ($N_2$) pressure in the reaction vessel to avoid disassociation of the ammonia into $N_2$ and $H_2$;
   (d) raising the reaction vessel's temperature to attain a supercritical state for the ammonia; and
   (e) ammonothermally growing the group III-nitride crystals, wherein convection of the supercritical ammonia transfers the source materials and deposits the transferred source materials onto the seed crystals.

2. The method of claim 1, wherein the extra nitrogen ($N_2$) pressure in the adding step (c) is more than 100 atm.

3. The method of claim 2, wherein the group III-containing source materials are either metallic Ga, polycrystalline GaN, amorphous GaN or a mixture thereof, and the group III-nitride seed crystals are GaN.

4. The method of claim 3, wherein the reaction vessel is divided into a dissolution region and a crystallization region with a convection-restricting device, the group III-containing source materials are placed in a dissolution region, the group III-nitride seed crystals are placed in the crystallization region, and the crystallization region's temperature is maintained at 550° C. or higher.

5. The method of claim 4, wherein the mineralizers contain at least one substance selected from $LiNH_2$, $NaNH_2$, and $KNH_2$, and the dissolution region's temperature is maintained lower than the crystallization region's temperature.

6. The method of claim 5, wherein an inner surface of the reaction vessel is protected with a liner material containing vanadium.

7. The method of claim 4, wherein the mineralizers contain at least one substance selected from $NH_4F$, $NH_4Cl$, $NH_4Br$, and $NH_4I$, and the dissolution region's temperature is maintained higher than the crystallization region's temperature.

8. The method of claim 7, wherein an inner surface of the reaction vessel is protected with a liner material containing platinum or palladium.

9. The method of claim 4, wherein the group III-containing source materials contain metallic Ga and the method further comprises transforming the metallic Ga into a substance that contains Ga and N.

10. The method of claim 9, wherein the transforming step further comprises holding the reaction vessel's temperature lower than 300° C. for more than 1 hour before raising the reaction vessel's temperature for crystal growth.

11. The method of claim 10, wherein the mineralizers contain at least one substance selected from $LiNH_2$, $NaNH_2$, and $KNH_2$, and the dissolution region's temperature is maintained lower than the crystallization region's temperature.

12. The method of claim 11, wherein an inner surface of the reaction vessel is protected with a liner material containing vanadium.

13. The method of claim 10, wherein the mineralizers contain at least one substance selected from $NH_4F$, $NH_4Cl$, $NH_4Br$, and $NH_4I$, and the dissolution region's temperature is maintained higher than the crystallization region's temperature.

14. The method of claim 13, wherein an inner surface of the reaction vessel is protected with a liner material containing platinum or palladium.

15. A group III-nitride crystal grown by the method of claim 1.

16. The group III-nitride crystal of claim 15, further comprising a single crystalline group III-nitride crystal.

17. The group III-nitride crystal of claim 16, further comprising a single crystalline group III-nitride wafer sliced from the single crystalline group III-nitride crystal.

18. The group III-nitride crystal of claim 15, wherein the group III-nitride crystal is a gallium nitride crystal.

* * * * *